(12) United States Patent
Ikeda et al.

(10) Patent No.: US 10,630,238 B2
(45) Date of Patent: Apr. 21, 2020

(54) DETECTOR CIRCUIT

(71) Applicant: Hitachi, Ltd., Chiyoda-ku, Tokyo (JP)

(72) Inventors: Yasuhiro Ikeda, Tokyo (JP); Toru Yazaki, Tokyo (JP); Yutaka Uematsu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/301,471

(22) PCT Filed: Aug. 2, 2016

(86) PCT No.: PCT/JP2016/072646
§ 371 (c)(1),
(2) Date: Nov. 14, 2018

(87) PCT Pub. No.: WO2018/025324
PCT Pub. Date: Feb. 8, 2018

(65) Prior Publication Data
US 2019/0190450 A1    Jun. 20, 2019

(51) Int. Cl.
*H03D 1/10* (2006.01)
*H03D 1/18* (2006.01)
*H03D 1/00* (2006.01)
*G05F 3/26* (2006.01)

(52) U.S. Cl.
CPC ............... *H03D 1/10* (2013.01); *G05F 3/262* (2013.01); *H03D 1/00* (2013.01); *H03D 1/18* (2013.01); *H03D 2200/0033* (2013.01); *H03D 2200/0043* (2013.01)

(58) Field of Classification Search
CPC . G05F 3/262; H03D 1/18; H03D 1/10; H03D 1/00; H03D 2200/0043; G01R 19/22; G01R 21/00

USPC ......... 329/370, 366, 365, 347, 352; 324/119
See application file for complete search history.

(56) References Cited

U.S. PATENT DOCUMENTS

2012/0235733 A1*  9/2012  Nakamoto ............ G01R 21/12
                                          327/541
2015/0136857 A1   5/2015  Pillin et al.

FOREIGN PATENT DOCUMENTS

| JP | 61-269076 A | 11/1986 |
| JP | 11-298252 A | 10/1999 |
| JP | 2012-195910 A | 10/2012 |

OTHER PUBLICATIONS

International Search Report (PCT/ISA/210) issued in PCT Application No. PCT/JP2016/072646 dated Oct. 25, 2016 with English translation (four (4) pages).
Japanese-language Written Opinion (PCT/ISA/237) issued in PCT/JP2016/072646 dated Oct. 25, 2016 (three (3) pages).

* cited by examiner

*Primary Examiner* — Arnold M Kinkead
(74) *Attorney, Agent, or Firm* — Crowell & Moring LLP

(57) ABSTRACT

A detector circuit in which a change in a detection voltage due to temperature is suppressed is provided. The detector circuit includes a first rectification element having an anode to which an input signal is inputted. A second rectification element has a cathode connected with a cathode of the first rectification element and has an anode connected to an output terminal. A current mirror circuit for supplying a current to the first rectification element and for supplying a current-mirror current of the current to the second rectification element is included in the detector circuit.

7 Claims, 12 Drawing Sheets

[FIG. 1]
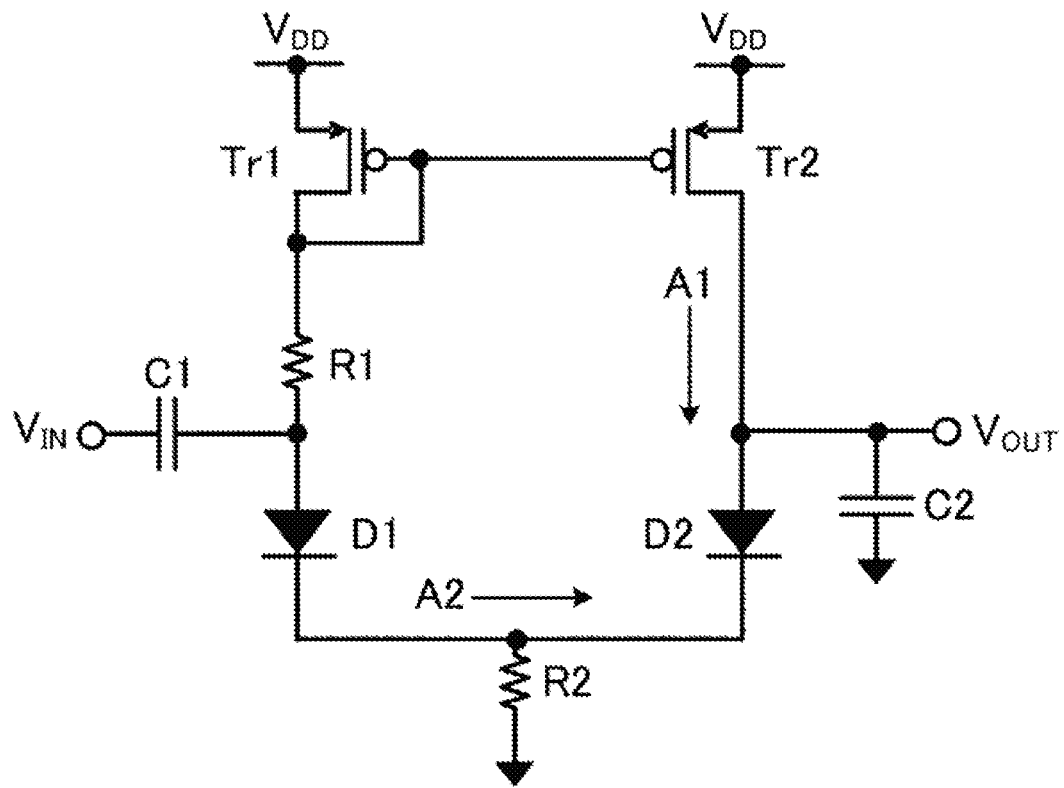
[FIG. 2]
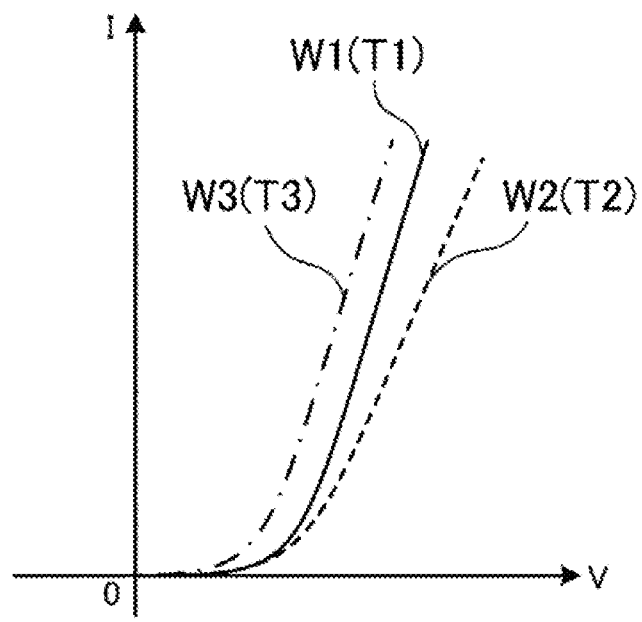

[FIG. 3]
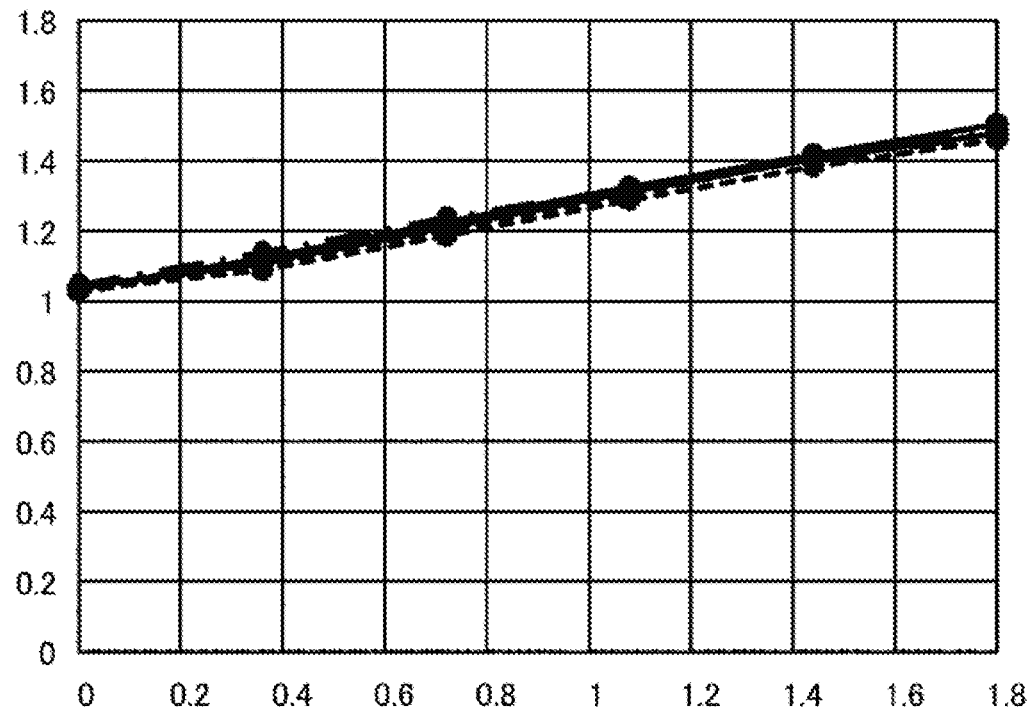
[FIG. 4]
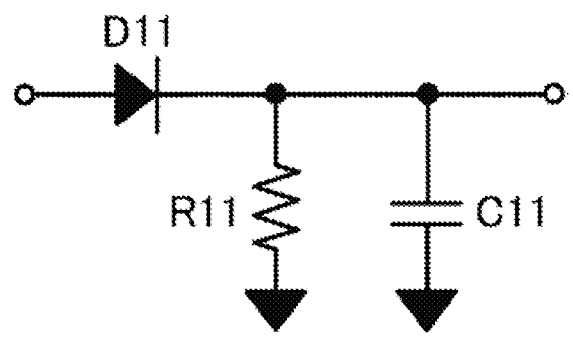

[FIG. 5]
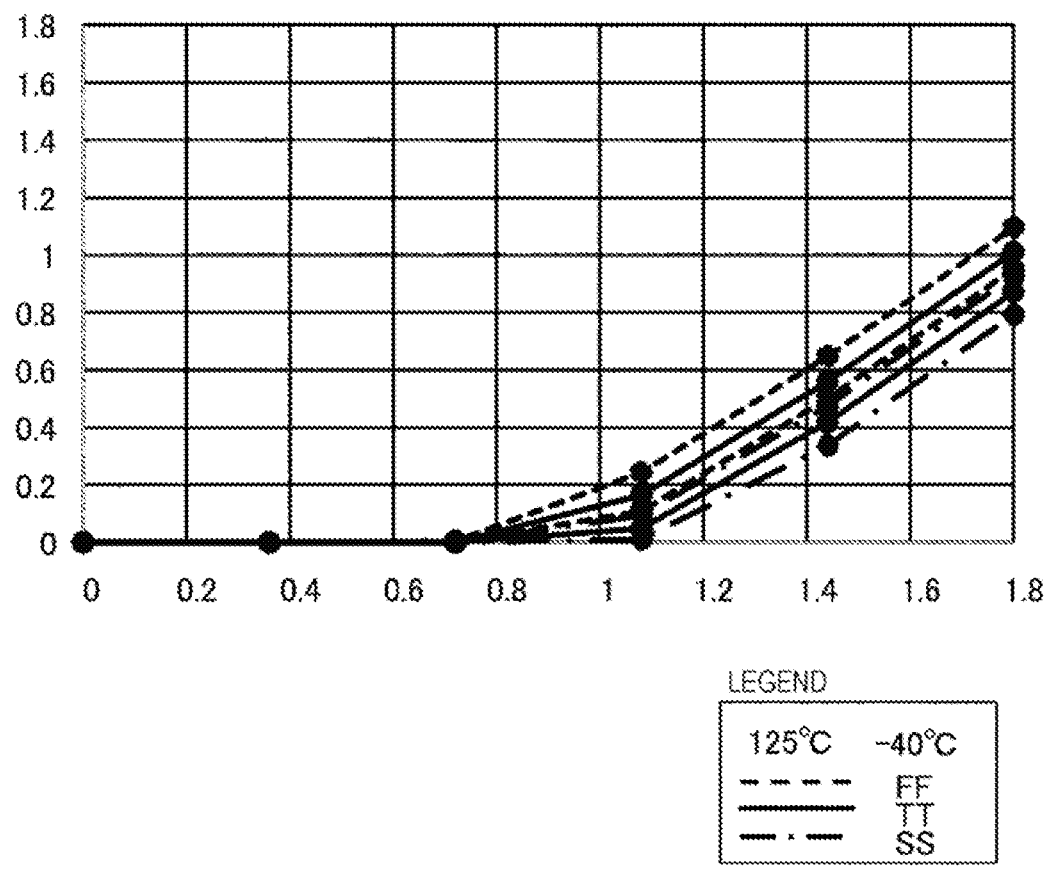

[FIG. 6]
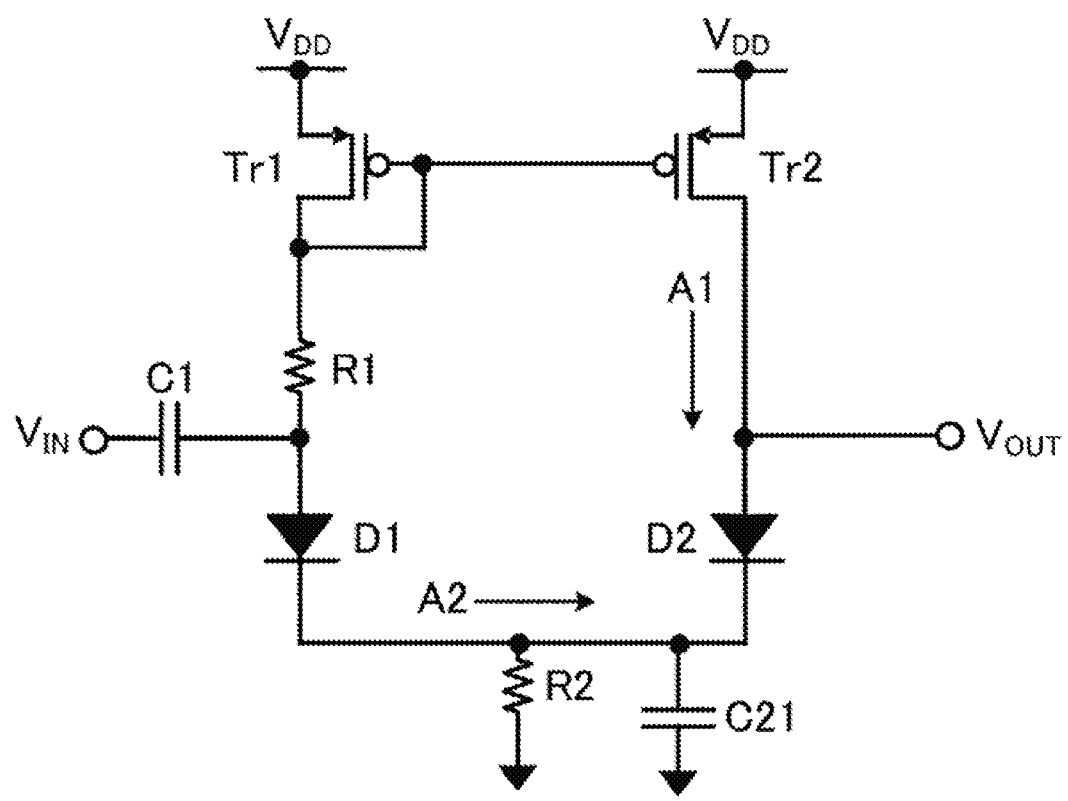

[FIG. 8]
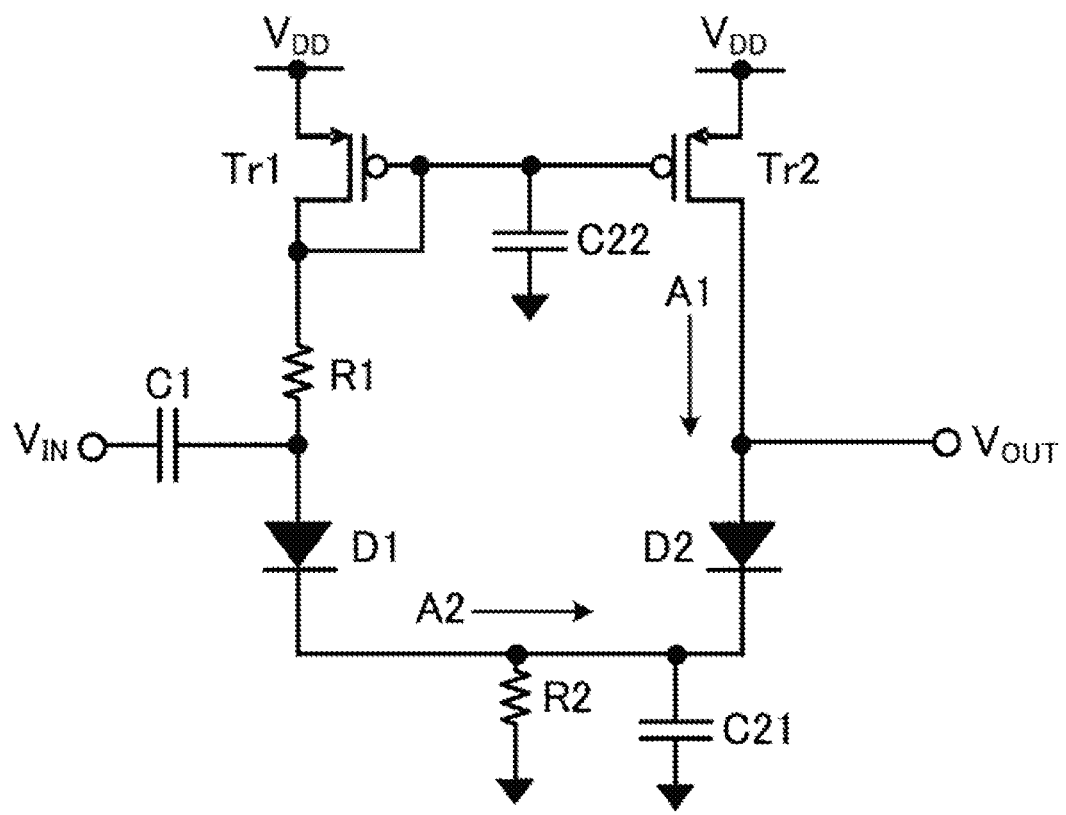

[FIG. 9]
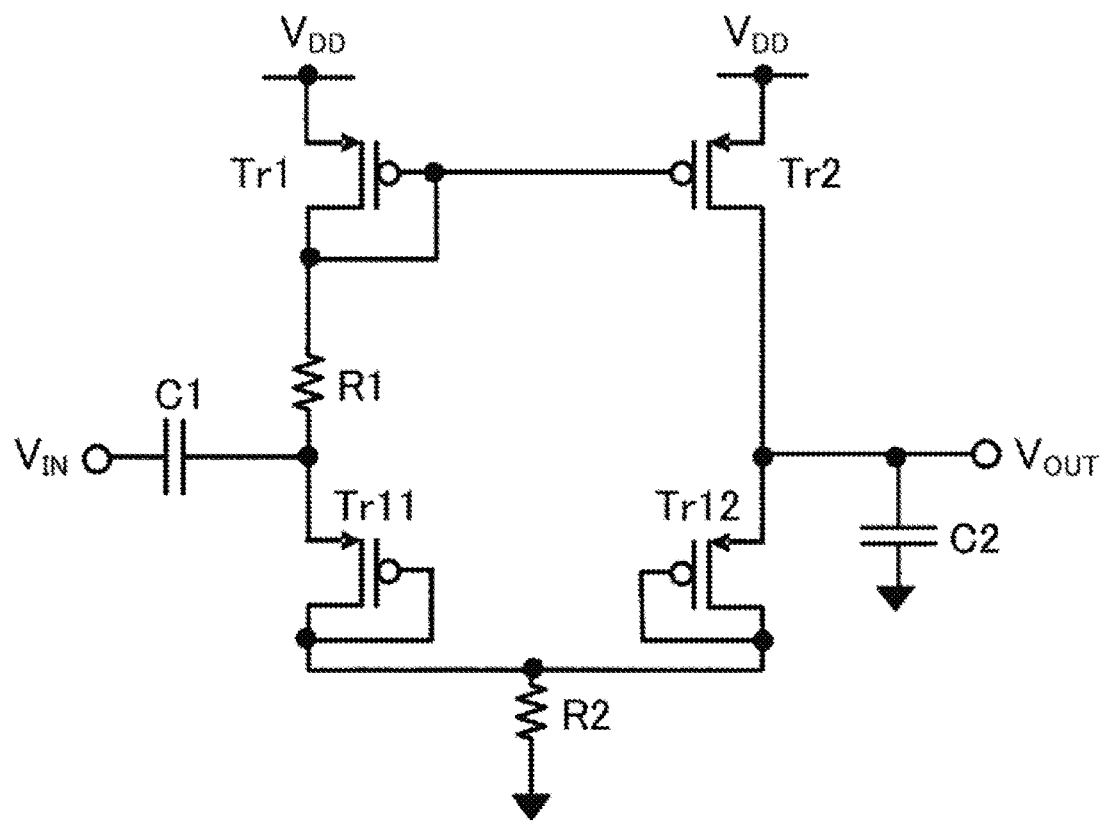

[FIG. 10]
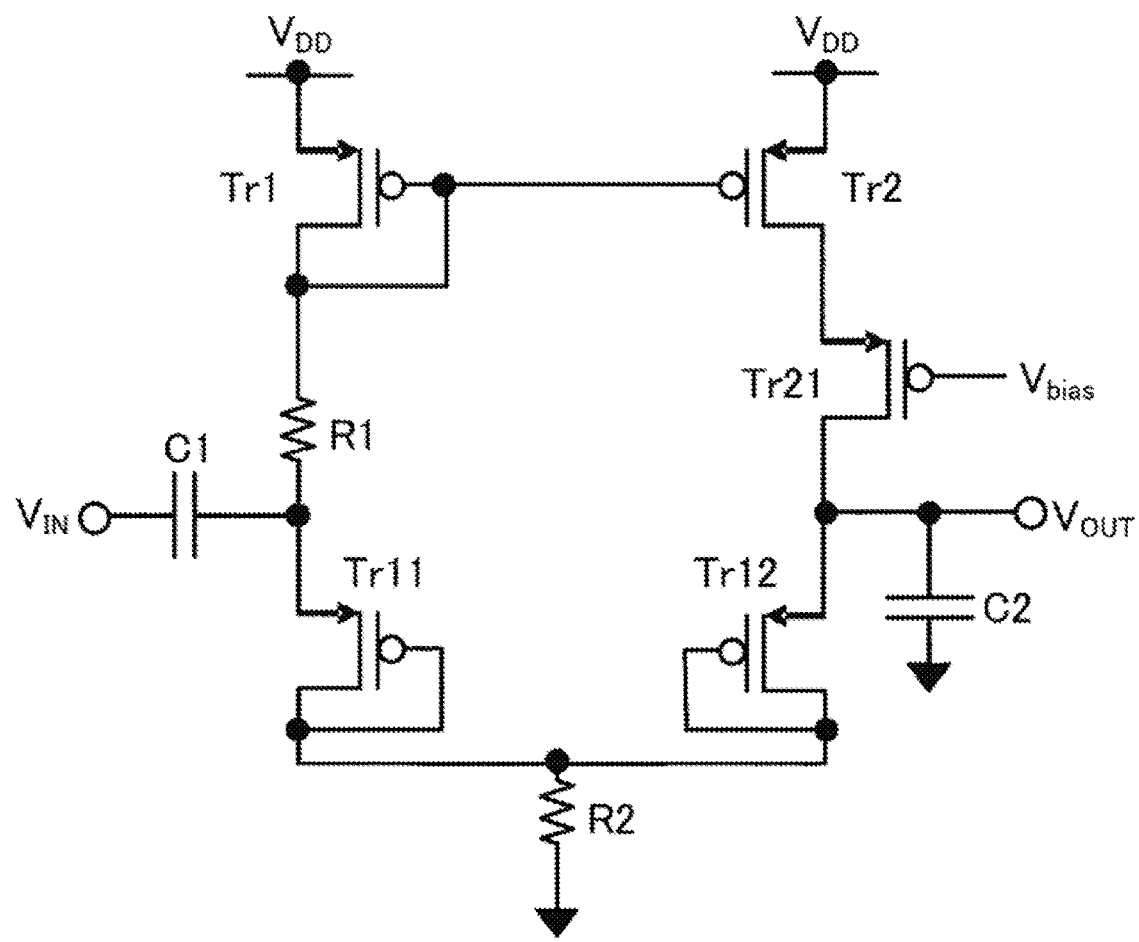

[FIG. 11]
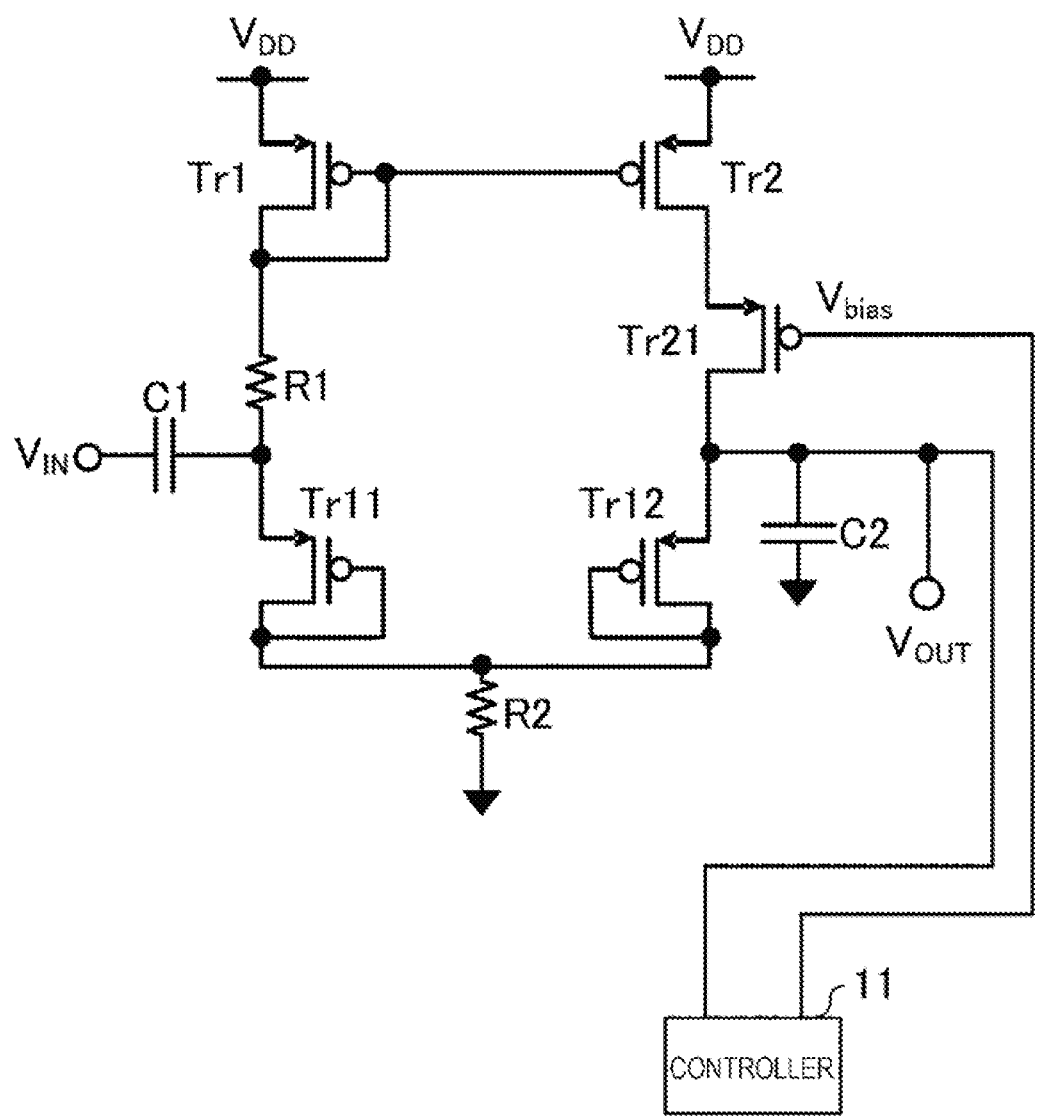

[FIG. 12]
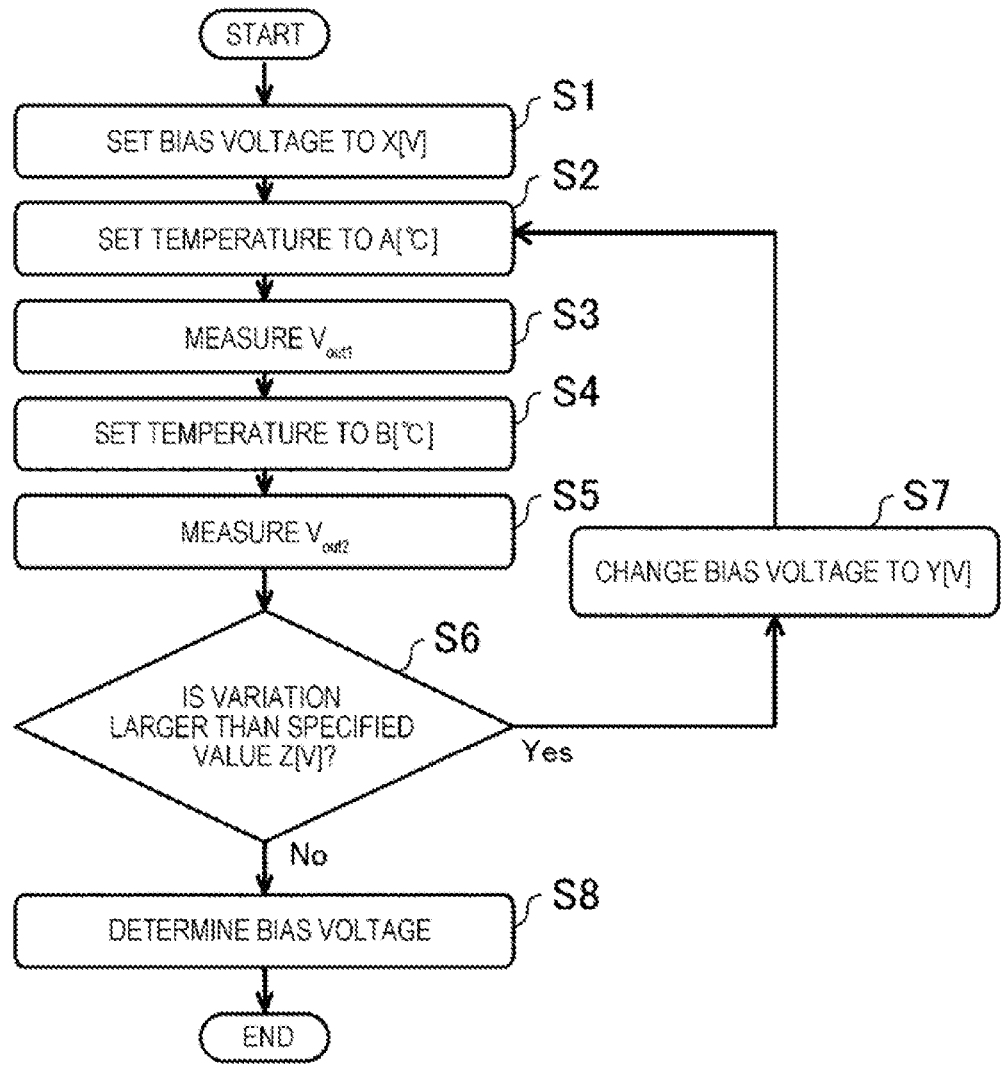
[FIG. 13]
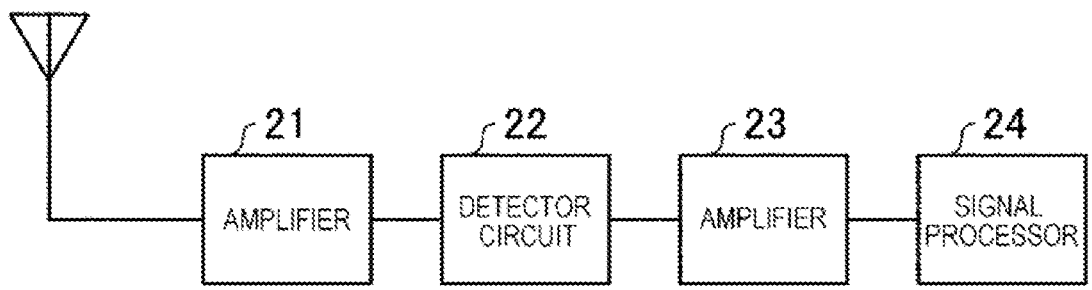

[FIG. 14]
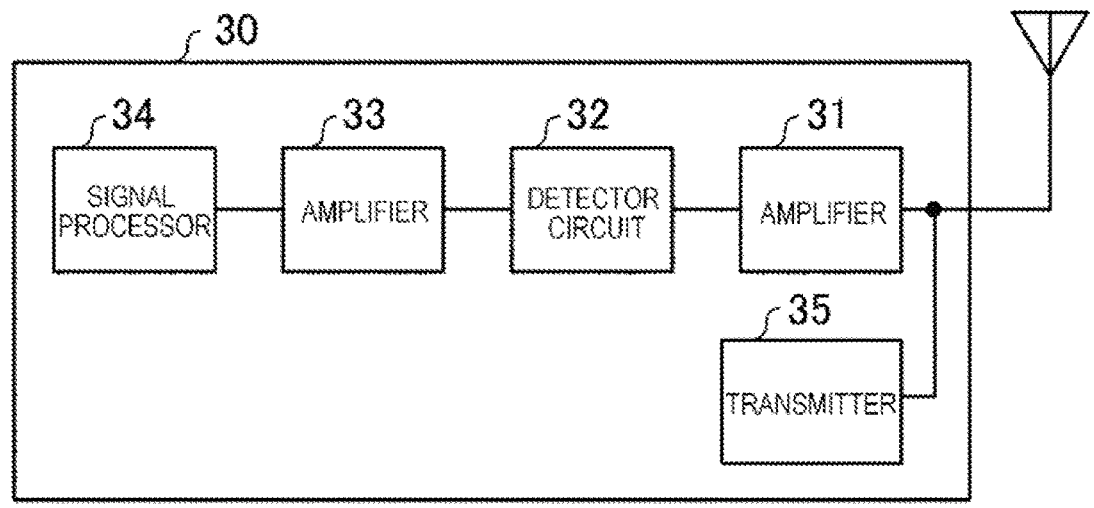
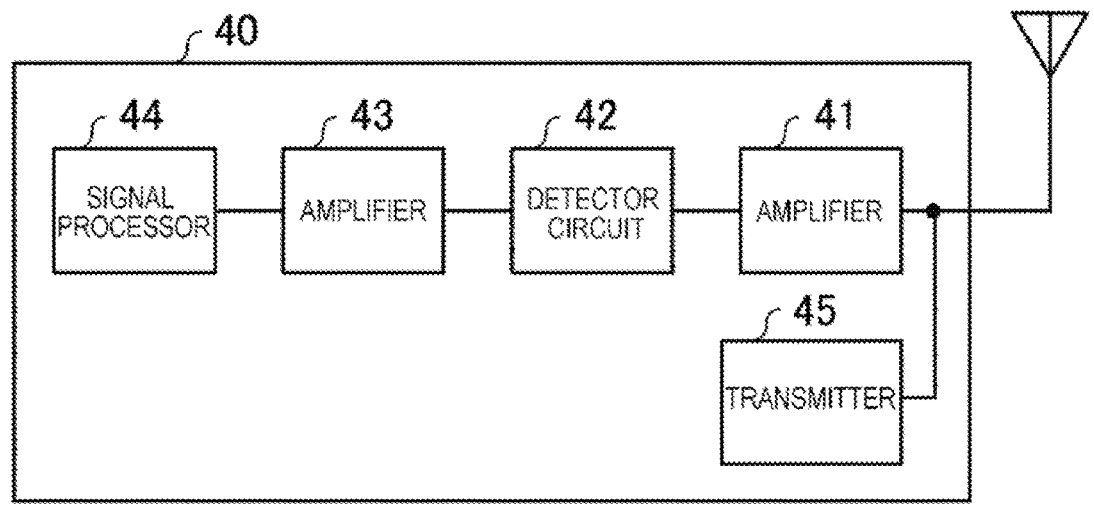
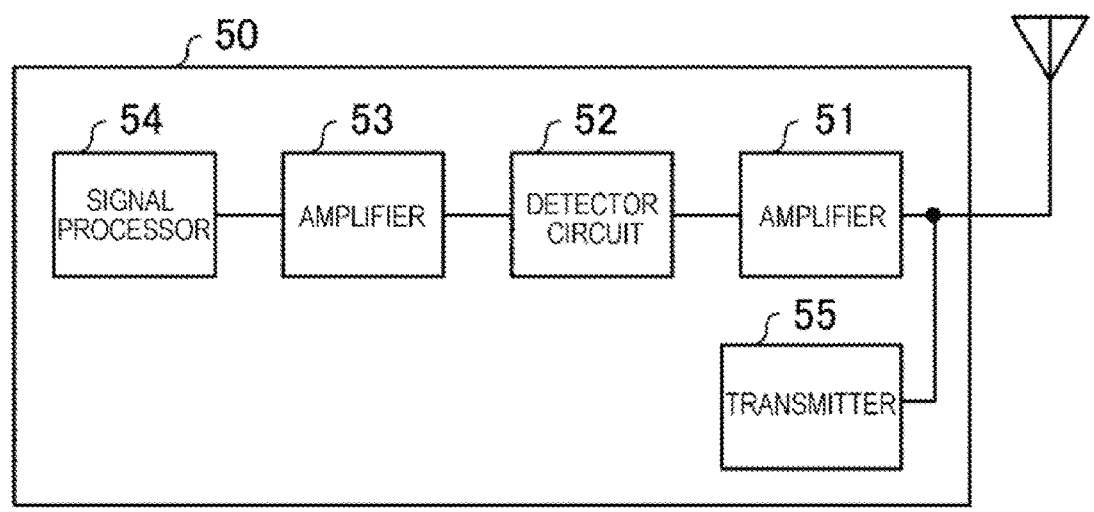

[FIG. 15]
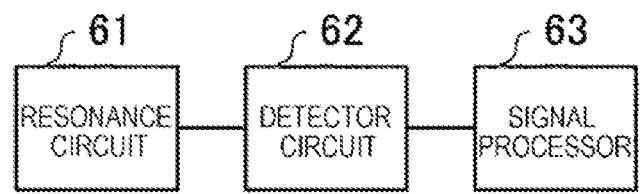

DETECTOR CIRCUIT

TECHNICAL FIELD

The present invention relates to a detector circuit.

BACKGROUND ART

PTL 1 discloses that "an envelope detector circuit which operates at an operating frequency greater than or equal to 900 MHz and input power less than or equal to −30 dBm, and compensates for a temperature characteristic by using a thermistor, from among envelope detector circuits using diodes in an AGC circuit".

CITATION LIST

Patent Literature

PTL 1: JP-A-11-298252

SUMMARY OF INVENTION

Technical Problem

In PTL 1, a temperature of an envelope detector circuit is compensated by using a thermistor. In PTL 1, when there is a difference in the temperature characteristic between a diode and a thermistor, the envelope detector circuit cannot perform an appropriate temperature compensation operation. In addition, the diode and the thermistor have different types of elements, and thus it is difficult to match the temperature characteristics.

An object of the present invention is to provide technology for suppressing a change in a detection voltage caused by a temperature.

Solution to Problem

The present application includes a plurality of means for solving at least part of the above-described problem, and an example thereof is as follows. To solve the above-described problem, a detector circuit according to the present invention includes: a first rectification element having an anode to which an input signal is inputted; a second rectification element having a cathode connected with a cathode of the first rectification element and having an anode connected to an output terminal; and a current mirror circuit for supplying a current to the first rectification element, and for supplying a current-mirror current of the current to the second rectification element.

Advantageous Effects of Invention

According to the present invention, a change in a detection voltage caused by a temperature can be suppressed. Other objects, configurations, and effects that have not been mentioned above will be obvious based on the following descriptions of embodiments.

BRIEF DESCRIPTION OF DRAWINGS

FIG. 1 is a circuit diagram illustrating an example of a detector circuit according to a first embodiment of the present invention.

FIG. 2 is a view for describing a temperature characteristic of a diode.

FIG. 3 is a view illustrating a result of analyzing the detector circuit of FIG. 1.

FIG. 4 is a view illustrating a detector circuit for comparison.

FIG. 5 is a view illustrating a result of analyzing the detector circuit for comparison of FIG. 4.

FIG. 6 is a circuit diagram illustrating an example of a detector circuit according to a second embodiment of the present invention.

FIG. 8 is a circuit diagram illustrating another circuit example of the detector circuit.

FIG. 9 is a circuit diagram illustrating an example of a detector circuit according to a third embodiment of the present invention.

FIG. 10 is a circuit diagram illustrating an example of a detector circuit according to a fourth embodiment of the present invention.

FIG. 11 is a circuit diagram illustrating an example of a detector circuit according to a fifth embodiment of the present invention.

FIG. 12 is a flowchart for describing determination of a bias voltage.

FIG. 13 is a first exemplary diagram illustrating an application example of the detector circuit.

FIG. 14 is a second exemplary diagram illustrating another application example of the detector circuit.

FIG. 15 is a third exemplary diagram illustrating still another application example of the detector circuit.

DESCRIPTION OF EMBODIMENTS

Figure 7A:
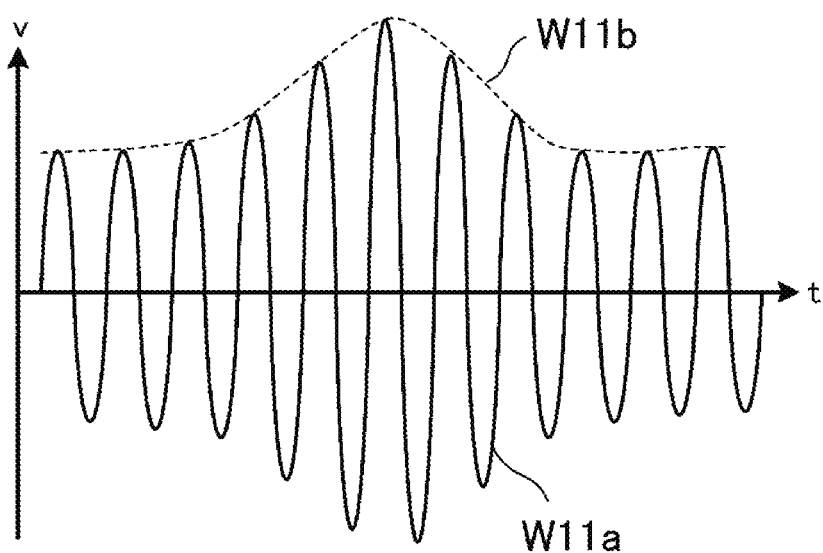
FIGS. 7A-7B are views illustrating an example of an input signal and an output signal of the detector circuit of FIG. 6.

Hereinafter, embodiments of the present invention will be described with reference to the accompanying drawings.

First Embodiment

FIG. 1 is a circuit diagram illustrating an example of a detector circuit according to a first embodiment of the present invention. As illustrated in FIG. 1, the detector circuit includes transistors Tr1 and Tr2, resistors R1 and R2, capacitors C1 and C2, and diodes D1 and D2.

The transistor Tr1 is, for example, a P type metal oxide semiconductor (PMOS) transistor. A source of the transistor Tr1 is connected to a power source of a voltage $V_{DD}$. A gate of the transistor Tr1 is connected to a drain, and is connected to one end of the resistor R1.

The other end of the resistor R1 is connected with one end of the capacitor C1 and with an anode of the diode D1.

The other end of the capacitor C1 is connected to an input terminal. An input signal $V_{IN}$ to be envelope-detected is inputted to the input terminal.

A cathode of the diode D1 is connected to one end of the resistor R2. The other end of the resistor R2 is connected to the ground.

The transistor Tr2 is, for example, a PMOS transistor. A source of the transistor Tr2 is connected to a power source of the voltage $V_{DD}$. A gate of the transistor Tr2 is connected to the gate and the drain of the transistor Tr1. A drain of the transistor Tr2 is connected with an anode of the diode D2, and with an output terminal outputting an output signal (detection voltage) $V_{OUT}$ which is envelope-detected.

One end of the capacitor C2 is connected with the anode of the diode D2 and the output terminal. The other end of the capacitor C2 is connected to the ground.

A cathode of the diode D2 is connected to one end of the resistor R2 and the cathode of the diode D1.

The input signal $V_{IN}$ is inputted to the anode of the diode D1 via the capacitor C1. The capacitor C1 is a capacitor which removes a direct current component included in the input signal $V_{IN}$. The capacitor C1 is not required, for example, according to a circuit connected to a front stage of the input terminal or specification.

The transistors Tr1 and Tr2 constitute a current mirror circuit. The current mirror circuit constituted by the transistors Tr1 and Tr2 supplies a bias current to the diode D1, and supplies a current-mirror current (copy current) of the bias current to the diode D2.

The input signal $V_{IN}$ inputted to the input terminal is half-wave rectified by the diode D1 and the resistor R2. The half-wave rectified input signal $V_{IN}$ charges the capacitor C2 by the current-mirror current flowing in the diode D2. Accordingly, the envelope-detected output terminal $V_{OUT}$ is outputted to the output terminal connected with one end of the capacitor C2.

Hereinafter, a temperature characteristic of a diode will be described. FIG. 2 is a view illustrating a temperature characteristic of a diode. In FIG. 2, a V-I characteristic of the diode is illustrated. A waveform W1 illustrated in FIG. 2 indicates a V-I characteristic of the diode at a temperature T1. Waveforms W2 and W3 indicate V-I characteristics of the diode at temperatures T2 and T3.

As indicated by the waveforms W1 and W2, the diode may have the slope of the V-I characteristic changed due to the temperature. In addition, as indicated by the waveforms W1 and W3, the diode may have a forward voltage changed due to the temperature (the waveform W3 is a waveform shifted from the waveform W1 in parallel). The diode may have the slope of the V-I characteristic changed due to the temperature, and may have the forward voltage changed due to the temperature.

When the V-I characteristic of the diode is changed due to the temperature as described above, the output signal of the detector circuit may be changed due to the temperature. Therefore, the detector circuit of FIG. 1 suppresses the temperature dependency of the output signal $V_{OUT}$ according to a change in the temperature of the diode D1, by means of the current mirror circuit constituted by the transistors Tr1 and Tr2, and the diode D2 having the cathode connected with the cathode of the diode D1.

For example, a bias current corresponding to a voltage of the input signal $V_{IN}$ flows in the diode D1 of the detector circuit of FIG. 1. The bias current flowing in the diode D1 is copied to the diode D2 by the current mirror circuit as indicated by a path A1 of FIG. 1. Accordingly, when the bias current "$I_{AC}$" flowing in the diode D1 is changed to "$I_{AC}+\Delta I_{AC}$" due to the temperature, a current flowing in the diode D2 is also changed from "$I_{AC}$" to "$I_{AC}+\Delta I_{AC}$".

A voltage change "$\Delta V_{AC}$" at both ends of the diode D1 caused by the current change of "$\Delta I_{AC}$" is canceled by a voltage change "$\Delta V_{AC}$" at both ends of the diode D2, generated by the current-mirror current. That is, the temperature dependency of the output signal $V_{OUT}$ outputted to the output terminal is suppressed.

The detector circuit of FIG. 1 cancels the forward voltage of the diode D1 by the diode D2 according to a path A2 illustrated in FIG. 1. Accordingly, even when the forward voltage "$V_F$" of the diodes D1 and D2 is changed to "$V_F+\Delta V_{DC}$" due to the temperature, a variation "$\Delta V_{DC}$" is canceled by the diodes D1 and D2.

As described above, the detector circuit of FIG. 1 cancels the characteristic change caused by the temperature of the diode D1, by means of the current mirror circuit and the diode D2. That is, the detector circuit of FIG. 1 can output the output signal $V_{OUT}$ of which temperature dependency is suppressed.

Hereinafter, an operating principle of the detector circuit will be described by using equations. A voltage amplitude of the input terminal is indicated by "$\Delta V_{IN}$", a voltage of the output terminal is indicated by "$V_{OUT}$", a voltage at a connection point between the resistor R1 and the diode D1 is indicated by "$V_A$", a current flowing in the transistors Tr1 and Tr2 is indicated by "$I_D$", forward voltages of the diodes D1 and D2 are indicated by "$V_{D1}$" and "$V_{D2}$", and resistance values of the resistors R1 and R2 are indicated by "$R_1$" and "$R_2$". When an alternating current component and a direct current component of a parameter are distinguished, they are distinguished by "_AC" and "_DC". A parameter which does not show "_AC" and "_DC" indicates a direct current component.

The following Equations (1) and (2) are established by the circuit diagram of FIG. 1.

$$V_{OUT}=V_{D2}+R_2*2(I_{D\_DC}+I_{D\_DC}) \quad (1)$$

$$V_A+\Delta V_{IN}=V_{D1}+R_2*2(I_{D\_DC}+I_{D\_AC}) \quad (2)$$

According to Equations (1) and (2), $$V_{OUT}=V_{D2}-V_{D1}+V_A+\Delta V_{IN} \quad (3)$$

herein, according to "$V_{D2}=V_{D1}$", $$V_{OUT}=V_A+\Delta V_{IN} \quad (4)$$

"$V_A$" is obtained. When a voltage drop of the transistor Tr1 is "$V_{D3}$", $$V_{DD}=V_{D3}+R_1*I_D+V_A \quad (5)$$

$$V_A=V_{D1}+R_2*2I_D \quad (6)$$

according to Equations (5) and (6), $$V_A=V_{DD}/2 \quad (7)$$

(herein, $V_{D3}=V_{D1}$, $R_1=2R_2$)

and when Equation (7) is substituted for Equation (4), the voltage of the output terminal is expressed by the following Equation (8).

$$V_{OUT}=V_{DD}/2+\Delta V_{IN} \quad (8)$$

As shown in Equation (8), it can be seen that the output signal $V_{OUT}$ of the output terminal is indicated by a parameter without the temperature dependency.

FIG. 3 is a view illustrating a result of analyzing the detector circuit of FIG. 1. The horizontal axis of FIG. 3 indicates a voltage inputted to the input terminal. The vertical axis indicates a voltage outputted to the output terminal.

FIG. 3 illustrates a result of analyzing the detector circuit at temperatures of 125° C. and −40° C. as shown in the legend. In addition, FIG. 3 illustrates results of analyzing of the detector circuit in respective types of diodes when three types of diodes FF, TT, and SS are used as the diodes D1 and D2 of the detector circuit of FIG. 1. In FIG. 3, six waveforms are illustrated although they overlap one another and thus are not seen.

As illustrated in FIG. 3, a change in the output voltage to the input voltage, caused by the temperature, is suppressed in the detector circuit of FIG. 1.

FIG. 4 illustrates a detector circuit for comparison. The detector circuit for comparison illustrated in FIG. 4 includes a diode D11, a resistor R11, and a capacitor C11. Like the detector circuit of FIG. 1, the detector circuit for comparison does not include a circuit for compensating for the temperature dependency of the diode D11.

FIG. 5 is a view illustrating a result of analyzing the detector circuit for comparison of FIG. 4. The horizontal axis of FIG. 5 indicates a voltage inputted to the input terminal. The vertical axis indicates a voltage outputted to the output terminal.

FIG. 5 illustrates a result of analyzing the detector circuit for comparison at temperatures of 125° C. and −40° C. as shown in the legend. In addition, FIG. 5 illustrates results of analyzing of the detector circuit for comparison in respective types of diodes when three types of diodes FF, TT, and SS are used as the diode D11 of the detector circuit for comparison of FIG. 4.

As illustrated in FIG. 5, the output voltage to the input voltage is changed due to the temperature in the detector circuit for comparison of FIG. 4. For example, when the temperature is reduced, the output voltage is reduced. On the contrary, a change in the output voltage to the input voltage due to the temperature is suppressed in the detector circuit of FIG. 1 as described in FIG. 3.

As described above, the detector circuit includes the diode D1 having the anode to which the input signal $V_{IN}$ is inputted, the diode D2 having the cathode connected with the cathode of the diode D1, and having the anode connected to the output terminal, and the current mirror circuit constituted by the transistors Tr1 and Tr2, for supplying a bias current to the diode D1 and supplying a current-mirror current of the bias current to the diode D2. Accordingly, the detector circuit can suppress a change in the output signal $V_{OUT}$ due to the temperature.

It is desirable that a variation in the temperature characteristic of the diodes D1 and D2 is within ten times. For example, it is desirable that, when the forward voltage is 1 V, a current varies within a range of "3 A to 0.3 A". A variation in the temperature characteristic of the diodes D1 and D2 may be changed according to a specification of a system using the detector circuit.

Second Embodiment

In a second embodiment, a location of a capacitor charged with a half-wave rectified signal is different.

FIG. 6 is a circuit diagram illustrating an example of a detector circuit according to the second embodiment of the present invention. In FIG. 6, the same reference numerals are used for the same elements as in FIG. 1.

In the detector circuit of FIG. 6, the capacitor C2 connected to the output terminal is omitted, compared with the detector circuit of FIG. 1. In the detector circuit of FIG. 6, a capacitor C21 is connected between the cathode of the diode D2 and the ground.

The input signal $V_{IN}$ inputted to the input terminal is half-wave rectified by the diode D1 and the resistor R2. The half-wave rectified input signal $V_{IN}$ charges the capacitor C21. Accordingly, the envelope-detected output signal $V_{OUT}$ is outputted to the output terminal.

A bias current corresponding to the input signal $V_{IN}$ flows in the diode D1 of the detector circuit. The bias current flowing in the diode D1 also flows in the diode D2 by the current mirror circuit as indicated by the path A1 of FIG. 6. For the reason, the input signal $V_{IN}$ component is included in the output signal $V_{OUT}$.

Figure 7B:
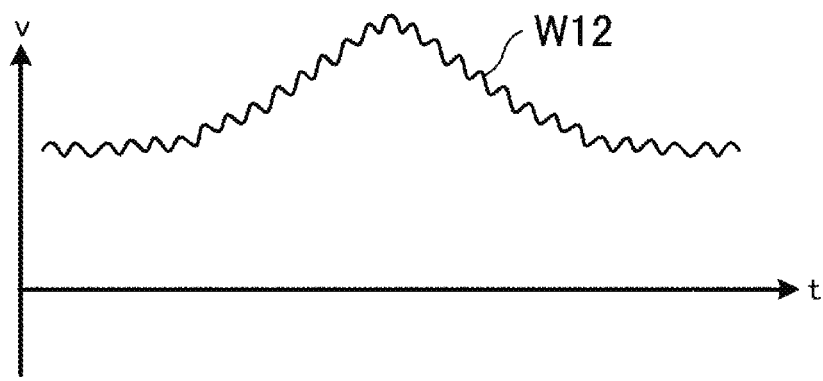

FIG. 7 is a view illustrating an example of the input signal $V_{IN}$ and the output signal $V_{OUT}$ of the detector circuit of FIG. 6. The horizontal axis in FIG. 7 indicates time, and the vertical axis indicates a voltage. A waveform W11a illustrated in (A) of FIG. 7 indicates the input signal $V_{IN}$ inputted to the input terminal of the detector circuit of FIG. 6. A dashed waveform W11b illustrated in (A) of FIG. 7 indicates an envelope of the input signal $V_{IN}$ indicated by the waveform W11a.

A waveform W12 illustrated in (B) of FIG. 7 indicates the output signal $V_{OUT}$ outputted to the output terminal of the detector circuit of FIG. 6. As indicated by the waveform W12 in (B) of FIG. 7, the output signal $V_{OUT}$ includes the input signal $V_{IN}$ component.

FIG. 8 is a circuit diagram illustrating another circuit example of the detector circuit. In FIG. 8, the same reference numerals are used for the same elements as in FIG. 6. In the detector circuit of FIG. 8, a capacitor C22 is connected between gates of the transistors Tr1 and Tr2 and the ground.

In the detector circuit of FIG. 8, the input signal $V_{IN}$ component included in the output signal $V_{OUT}$ is suppressed by the capacitor C22. Accordingly, in the detector circuit of FIG. 8, the output signal $V_{OUT}$ has a waveform as indicated by the waveform W11b in (A) of FIG. 7.

The capacitor C22 is not required, for example, according to a circuit connected to a rear stage of the output terminal or a specification. For example, when the size of the input signal $V_{IN}$ component included in the output signal $V_{OUT}$ is an allowable size in the specification of a system using the detector circuit of FIG. 8, the capacitor C22 may be omitted.

As described above, the capacitor C21 may be connected to the cathode of the diode D2. By doing so, the detector circuit can suppress a change in the output signal $V_{OUT}$ due to the temperature.

The capacitor C22 may be connected to the gates of the transistors Tr1 and Tr2. Accordingly, the input signal $V_{IN}$ component included in the output signal $V_{OUT}$ can be suppressed.

Third Embodiment

In a third embodiment, a diode is realized by a transistor.

FIG. 9 is a circuit diagram illustrating an example of a detector circuit according to the third embodiment of the present invention. In FIG. 9, the same reference numerals are used for the same elements as in FIG. 1.

In the detector circuit of FIG. 9, the diodes D1 and D2 are replaced with transistors Tr11 and Tr12, compared with the detector circuit of FIG. 1. The transistors Tr11 and Tr12 are PMOS transistors, for example, and are diode-connected.

The transistors Tr1, Tr2, Tr11, and Tr12 are constituted by PMOS transistors of the same type, such that a change in the characteristic due to the temperature of each transistor or a process variation is made equal (including substantially equal, the same will be applied below). Accordingly, in the detector circuit of FIG. 9, the effect of suppressing a change in the output signal $V_{OUT}$ due to the temperature or a process variation is increased. This is because parameters depending on the temperature or a process become the same coefficient and are canceled out each other by constituting the detector circuit by the PMOS transistors of the same type.

Hereinafter, an operating principle of the detector circuit will be described by using equations. A voltage between a gate and a source of the transistor Tr11 is indicated by $V_{GS1}$, and a voltage between a gate and a source of the transistor Tr12 is indicated by $V_{GS2}$. In a case of the other parameters, the parameters described in FIG. 1 are used.

The following Equations (11) and (12) are established by the circuit diagram of FIG. 9.

$$V_{OUT}=V_{GS2}+R_2{}^*2I_D \qquad (11)$$

$$V_A+\Delta V_{IN}=V_{GS1}+R_2{}^*2I_D \qquad (12)$$

According to Equations (11) and (12), $$V_{OUT}=V_{GS2}-V_{GS1}+V_A+\Delta V_{IN} \qquad (13)$$

herein, when $V_{GS}=V_{TH}+(I_D/\beta)^{1/2}$ (herein, $\beta=\frac{1}{2}*\mu_P C_{OX}$ (W/L) is satisfied, $\mu_P$ indicates hole mobility, and $C_{OX}$ indicates a gate capacity per unit area), Equation (13) is expressed by the following Equation (14).

$$V_{OUT}=V_{TH2}+(I_D/\beta_2)^{1/2}-V_{TH1}-(I_D/\beta_1)^{1/2}+V_A+\Delta V_{IN} \qquad (14)$$

Herein, when aspect ratios (W/L) of the transistors Tr11 and Tr12 are the same, the following Equation (15) is obtained.

$$V_{OUT}=V_{TH1}-V_{TH2}+V_A+\Delta V_{IN} \qquad (15)$$

Furthermore, $V_{TH}$ is resolved as follows.

$$V_{TH}=V'^{TH}+\Delta V_{TH}(T) \qquad (16)$$

$\Delta V_{TH}(T)$ indicates a variation of a threshold voltage by the temperature dependency of the transistor.

The temperature dependencies of the PMOS transistors manufactured according to the same type, the same standard, and the same process are the same, and thus Equation (15) is expressed as follows.

$$V_{OUT}=V'_{TH1}-V'_{TH2}+V_A+\Delta V_{IN} \qquad (17)$$

Since the thresholds and $V'_{TH1}$ and $V'_{TH2}$ of the PMOS transistors are components that do not have the temperature dependency, if $V_A$ does not have the temperature dependency, $V_{OUT}$ becomes a voltage that is not changed due to the temperature. Accordingly, $V_A$ is obtained. When a voltage between the gate and the source of the transistor Tr1 is $V_{GS3}$, the following Equations (18) and (19) are established.

$$V_{DD}=V_{GS3}+R_1{}^*I_D+V_A \qquad (18)$$

$$V_A=V_{GS1}+R_2{}^*2I_D \qquad (19)$$

When $V_A=\frac{1}{2}(V_{DD}-V_{GS3}+V_{GS1}+I_D(2R_2-R_1))$ is obtained according to the two equations described above, and $R_1=2R_2$ is satisfied, $$V_A=\frac{1}{2}(V_{DD}-V_{GS3}+V_{GS1}) \qquad (20)$$

furthermore, since $V_{GS}=V_{TH}+(1_D/\beta)^{1/2}$ is satisfied, $$V_A=\frac{1}{2}(V_{DD}-V_{TH3}-(I_D/\beta_3)^{1/2}+V_{TH1}+(I_D/\beta_1)^{1/2}) \qquad (21)$$

herein, when aspect ratios (W/L) of the transistors Tr1 and the transistors Tr11 are the same, the following Equation (22) is obtained.

$$V_A=\frac{1}{2}(V_{DD}-V_{TH3}+V_{TH1}) \qquad (22)$$

Furthermore, when the threshold of the transistor is resolved into the component $V'_{TH}$ that does not have the temperature dependency, and the component $\Delta V_{TH}(T)$ that has the temperature dependency, similar to Equation (17), the component having the temperature dependency is offset as described above. Therefore, $$V_A=\frac{1}{2}(V_{DD}-V'_{TH3}+V'_{TH1}) \qquad (23)$$

is established.

That is, the output signal $V_{OUT}$ is expressed by the following Equation (24), and becomes a voltage that does not have the temperature dependency.

$$V_{OUT}=V'_{TH1}-V'_{TH2}+\frac{1}{2}(V_{DD}-V'_{TH3}+V'_{TH1})+\Delta V_{IN} \qquad (24)$$

Although the diode and the current mirror circuit are realized by the PMOS transistor in the above-described example, they may be constituted only by an NMOS transistor. In addition, they may be constituted by a combination of the PMOS transistor and the NMOS transistor. In addition, they may be constituted by a bipolar transistor.

As described above, the diodes D1 and D2 are constituted by the transistors Tr11 and Tr12 diode-connected, and the current mirror circuit is constituted by the transistors Tr1 and Tr2. In addition, the transistors Tr1, Tr2, Tr11, and Tr12 are manufactured according to the same type, the same standard, and the same process. Accordingly, the detector circuit can further suppress a change in the output signal $V_{OUT}$ due to the temperature.

In addition, the aspect ratios of the transistors Tr1, Tr2, Tr11, and Tr12 are made substantially the same. Accordingly, the detector circuit can further suppress a change in the output signal $V_{OUT}$ due to the temperature.

Fourth Embodiment

In a fourth embodiment, a change in the output signal due to the temperature is further suppressed by increasing the accuracy of current copy of the current mirror circuit.

FIG. 10 is a circuit diagram illustrating an example of a detector circuit according to the fourth embodiment of the present invention. In FIG. 10, the same reference numerals are used for the same elements as in FIG. 9. In the detector circuit of FIG. 10, a transistor Tr21 is cascode-connected to the transistor Tr2, compared with the detector circuit of FIG. 9.

A bias voltage $V_{bias}$ is inputted to a gate of the transistor Tr21. The transistor Tr21 adjusts a current-mirror current flowing in the transistor Tr2 by the bias voltage $V_{bias}$ inputted to the gate. The bias voltage $V_{bias}$ is adjusted such that a current flowing in the transistor Tr2 is the same as a current flowing in the transistor Tr1. That is, the detector circuit of FIG. 10 increases the accuracy of copy of the current-mirror current by the bias voltage $V_{bias}$. The bias voltage $V_{bias}$ is determined, for example, according to a manufacturing process variation determined at the time of manufacturing the detector circuit.

As described above, the current mirror circuit of the detector circuit includes the transistor Tr21 which is cascode-connected to the transistor Tr2 supplying the current-mirror current to the diode D2, and adjusts the current-mirror current. Accordingly, the detector circuit can further suppress a change in the output signal $V_{OUT}$ due to the temperature.

Fifth Embodiment

In a fifth embodiment, the detector circuit includes a controller for calibrating the current-mirror current of the current mirror circuit.

FIG. 11 is a circuit diagram illustrating an example of a detector circuit according to the fifth embodiment of the present invention. In FIG. 11, the same reference numerals are used for the same elements as in FIG. 10. The detector circuit of FIG. 11 includes a controller 11, compared with the detector circuit of FIG. 10.

The controller 11 determines the bias voltage $V_{bias}$ to be outputted to the transistor Tr21, based on an output voltage at a first temperature, and an output voltage at a second temperature.

FIG. 12 is a flowchart illustrating determination of the bias voltage $V_{bias}$. The flowchart illustrated in FIG. 12 is performed before the detector circuit is released, for example.

First, the controller 11 sets the bias voltage $V_{bias}$ to X[V], in response to an instruction of a user (for example, a manufacturer of the detector circuit) (step S1).

Next, the user puts the detector circuit into a thermostatic tank, and sets a temperature of the thermostatic tank to A[° C.], for example (step S2).

Next, the controller 11 measures an output voltage $V_{OUT1}$ of the output terminal at the temperature of A[° C.] in response to a user's instruction (step S3).

Next, the user sets the temperature of the thermostatic tank to B[° C.] (step S4).

Next, the controller 11 measures an output voltage $V_{OUT2}$ of the output terminal at the temperature of B[° C.] in response to a user's instruction (step S5).

Next, the controller 11 determines whether a variation of the output voltage is larger than a specified value Z[V] (step S6). For example, the controller 11 determines whether a difference (absolute value) between the output voltage $V_{OUT1}$ measured in step S3 and the output voltage $V_{OUT1}$ measured in step S5 is larger than Z[V].

When it is determined that the variation of the output voltage is larger than the specified value Z[V] ("Yes" in step S6), the controller 11 changes the bias voltage $V_{bias}$ to Y[V] (step S7). When the controller 11 changes the bias voltage $V_{bias}$ to Y[V], the user sets the temperature of the thermostatic tank to A[° C.] (step S2).

When it is determined that the variation of the output voltage is not larger than the specified value Z[V] ("No" in step S6), the controller 11 determines the bias voltage $V_{bias}$ to be outputted to the gate of the transistor Tr21, to the bias voltage $V_{bias}$ set in step S1 or the bias voltage $V_{bias}$ changed in step S7. Accordingly, after the detector circuit is released, the bias voltage $V_{bias}$ determined in step S8 is outputted to the gate of the transistor Tr21.

As described above, the controller 11 determines the bias voltage $V_{bias}$ to be outputted to the transistor Tr21, based on the output voltage $V_{OUT1}$ at the first temperature, and the output voltage $V_{OUT2}$ at the second temperature. Accordingly, the detector circuit can further suppress a change in the output signal due to the temperature.

Hereinafter, application examples of the detector circuit described in each embodiment described above will be described.

FIG. 13 is a first exemplary diagram illustrating an application example of the detector circuit. In FIG. 13, an example of a communication device receiving radio waves is illustrated. The communication device includes amplifiers 21 and 23, a detector circuit 22, and a signal processor 24.

The amplifier 21 amplifies a signal received via an antenna. The detector circuit 22 is the detector circuit described in each embodiment described above. The detector circuit 22 envelope-detects a reception signal amplified by the amplifier 21. The amplifier 23 amplifies the reception signal envelope-detected by the detector circuit 22. The signal processor 24 performs signal processing of the reception signal amplified by the amplifier 23.

The communication device can obtain a detection voltage of which temperature dependency is suppressed by the detector circuit 22. Accordingly, the communication device can realize a high-precision signal processing system.

FIG. 14 is a second exemplary diagram illustrating another application example of the detector circuit. In FIG. 14, examples of communication devices 30, 40, and 50 transmitting and receiving radio waves are illustrated. The communication device 30 includes amplifiers 31 and 33, a detector circuit 32, a signal processor 34, and a transmitter 35. The communication device 40 includes amplifiers 41 and 43, a detector circuit 42, a signal processor 44, and a transmitter 45. The communication device 50 includes amplifiers 51 and 53, a detector circuit 52, a signal processor 54, and a transmitter 55.

The transmitters 35, 45, and 55 of the communication devices 30, 40, and 50 transmit predetermined radio signals to other communication devices 30, 40, and 50. The amplifiers 31, 33, 41, 43, 51, and 53, the detector circuits 32, 42, and 52, and the signal processors 34, 44, and 54 are the same as the amplifiers 21 and 23, the detector circuit 22, and the signal processor 24 described in FIG. 13, and thus a description thereof is omitted.

The communication device 30 is installed in a sign or a signal device on a road, for example. The communication devices 40 and 50 are mounted in vehicles, for example. The communication devices 40 and 50 mounted in vehicles perform wireless communication with the communication device 30 installed in the sign or the signal device, for example, and measure distances or the like between the vehicles and the sign or the signal device. In addition, the communication devices 40 and 50 mounted in the vehicles may perform wireless communication with each other, for example, and measure a distance between the vehicles. Accordingly, the vehicles can be automatically driven, for example.

The temperatures of the communication device 30 installed in the sign or the signal device on the road, or the communication devices 40 and 50 mounted in the vehicles are greatly changed according to an installation place or a driving place. Even in a place of a severe use environment having a great temperature change, the communication devices 30, 40, and 50 can obtain a detection voltage of which temperature dependency is suppressed by the detector circuits 32, 42, and 52. Accordingly, the communication devices 30, 40, and 50 can realize a high-precision signal processing system.

FIG. 15 is a third exemplary diagram illustrating still another application example of the detector circuit. In FIG. 15, an example of a test device for testing connection when a semiconductor chip is mounted on a substrate is illustrated.

When or after the semiconductor chip is mounted on the substrate, a crack or the like may occur in solder. When a crack occurs in the solder, a contact defect occurs. The test device illustrated in FIG. 15 determines a contact defect between the semiconductor chip and the substrate by using a resonance.

The test device includes a resonance circuit 61, a detector circuit 62, and a signal processor 63. The resonance circuit 61 is a circuit which resonates with the semiconductor chip and the substrate. The detector circuit 62 envelope-detects a resonance signal outputted from the resonance circuit 61. The signal processor 63 determines a contact defect of the semiconductor chip with the substrate, based on the resonance signal envelope-detected.

The test device can obtain a detection voltage of which temperature dependency is suppressed by the detector circuit 62. Accordingly, the test device can realize a high-precision semiconductor chip test system.

Although the case where the detector circuit is applied to the communication device or the test device has been described in the above-described examples, the application example is not limited thereto. The detector circuit is also applied to, for example, an electric control unit (ECU), an advanced driving assistant system (ADAS), an ultrasonic diagnosis device of a health care product, or the like.

The present invention is not limited to the above-described embodiments, and includes various modification examples. For example, the above-described embodiments describe the present invention in detail to make it easy to understand the present invention, and are not limited to inclusion of all elements described. It is possible to replace a part of a configuration of a certain embodiment with configurations of other embodiments, and it is possible to add the configurations of the other embodiments to the configuration of the certain embodiment. In addition, regarding a part of the configuration of each embodiment, addition, deletion, and replacement of other configurations are also possible.

REFERENCE SIGNS LIST

Tr1, Tr2: transistor
R1, R2: resistor
C1, C2: capacitor
D1, D2: diode
C21, C22: capacitor
Tr11, Tr12: transistor
Tr21: transistor
11: controller

The invention claimed is:

1. A detector circuit comprising:
a first rectification element having an anode to which an input signal is inputted;
a second rectification element having a cathode connected with a cathode of the first rectification element and having an anode connected to an output terminal; and
a current mirror circuit for supplying a current to the first rectification element, and for supplying a current-mirror current of the current to the second rectification element, wherein
the first rectification element and the second rectification element are constituted by diode-connected transistors,
the current mirror circuit is constituted by a transistor, and
aspect ratios of the first rectification element, the second rectification element, and the current mirror circuit are substantially the same.

2. The detector circuit according to claim 1, wherein a capacitive element is connected to the output terminal.

3. The detector circuit according to claim 2, wherein the capacitive element is connected to the cathode of the second rectification element.

4. The detector circuit according to claim 3, wherein the capacitive element is connected to gates of a first transistor and a second transistor constituting the current mirror circuit.

5. The detector circuit according to claim 1, wherein the first rectification element, the second rectification element, and the current mirror circuit are manufactured according to a same type, a same standard, and a same process.

6. The detector circuit according to claim 1, wherein the current mirror circuit includes
a first transistor for supplying the current-mirror current of the current to the second rectification element, and
a second transistor cascode-connected to the first transistor to adjust the current-mirror current.

7. The detector circuit according to claim 1, wherein the current mirror circuit includes
a first transistor for supplying the current-mirror current of the current to the second rectification element, and
a second transistor cascode-connected to the first transistor to adjust the current-mirror current, and
the detector circuit further includes a controller for determining a bias voltage to be outputted to the second transistor, based on an output voltage at a first temperature and an output voltage at a second temperature.

* * * * *